(12) United States Patent
Badaroglu

(10) Patent No.: US 8,233,579 B2
(45) Date of Patent: Jul. 31, 2012

(54) DEVICES COMPRISING DELAY LINE FOR APPLYING VARIABLE DELAY TO CLOCK SIGNAL

(75) Inventor: Mustafa Badaroglu, Leuven (BE)

(73) Assignee: IMEC, Leuven (BE)

(*) Notice: Subject to any disclaimer, the term of this patent is extended or adjusted under 35 U.S.C. 154(b) by 283 days.

(21) Appl. No.: 12/278,269

(22) PCT Filed: Feb. 2, 2007

(86) PCT No.: PCT/EP2007/051052
§ 371 (c)(1),
(2), (4) Date: May 24, 2010

(87) PCT Pub. No.: WO2007/088211
PCT Pub. Date: Aug. 9, 2007

(65) Prior Publication Data
US 2010/0225369 A1    Sep. 9, 2010

(30) Foreign Application Priority Data

Feb. 3, 2006 (EP) .................................. 06101272

(51) Int. Cl.
*H03D 3/24* (2006.01)
(52) U.S. Cl. ........................................................ 375/376
(58) Field of Classification Search .................. 375/239, 375/327, 376; 327/149, 158
See application file for complete search history.

(56) References Cited

U.S. PATENT DOCUMENTS 6,222,407 B1    4/2001 Gregor
6,329,854 B1*  12/2001 Lee et al. ...................... 327/158
6,525,585 B1    2/2003 Iida et al.
(Continued)

FOREIGN PATENT DOCUMENTS

JP        2004192202 A     7/2004

OTHER PUBLICATIONS

Chang et al., "A Wide-Range Delay-Locked Loop With a Fixed Latency of One Clock Cycle", IEEE Journal of Solid-State Circuits, 37(8), Aug. 2002.

(Continued)

*Primary Examiner* — Don N Vo
(74) *Attorney, Agent, or Firm* — McDonnell Boehnen Hulbert & Berghoff LLP

(57) ABSTRACT

The disclosure relates to a device comprising at least one delay line for applying a variable delay to a clock signal and a controller for controlling the variable delay of the delay line. Each delay line comprises a plurality of concatenated delay banks which provide different delay values with respect to each other, a bypass parallel over each of said the delay banks, and switching elements associated with each of the delay banks for selecting either the respective delay bank or the respective bypass. Each of the delay banks is provided with a delay bank status indicator for indicating propagation of the clock signal through the delay bank towards the controller. The controller is provided for taking the indicated propagation of the clock signal into account upon setting said switching elements. Devices according to this disclosure are, amongst other uses, suited for use in Ultra Wide Band (UWB) receiving or transmitting devices, in particular those devices, designed for low power consumption, by enabling power on and off switching of parts of such devices as analog to digital converters and integrators, during timing windows.

15 Claims, 8 Drawing Sheets

U.S. PATENT DOCUMENTS 7,234,069 B1 * 6/2007 Johnson ........................ 713/400
2004/0036515 A1 * 2/2004 Mikhalev et al. ............. 327/158

OTHER PUBLICATIONS

Wang et al., "A Low-Power Half-Delay-Line Fast Skew-Compensation Circuit", IEEE Journal of Solid-State Circuits, 39 (6) Jun. 2004.
IEEE 802.15 WPAN Low Rate Alternative PHY Task Group 4a (TG4a) www.ieee802.org/15/pub/TG4a.html (printed Apr. 23, 2010).
Yang et al., "Ultra-wideband communications: an idea whose time has come," IEEE Signal Processing Magazine, pp. 26-54, Nov. 2004.
S. Iida et al., "A 3.1 to 5GHz CMOS DSSS UWB transceiver for WPANs," ISSCC Digest of Tech. Papers, pp. 214-215, 594, Feb. 2005.
R. Blazquez et al., "A baseband processor for impulse ultra-wideband communications," IEEE J. Solid-State Circuits, 40(9): 1821-1828, Sep. 2005.
J. Ryckaert et al., "Carrier-based UWB impulse radio: simplicity, flexibility, and pulser implementation in 180 nm CMOS," Proc. IEEE Int. Conf. on UWB, Sep. 2005.
J. Ryckaert et al.,"Ultra-wideband transmitter for low-power wireless body area networks: design and evaluation," IEEE Tr. Circuits and Systems Part I, 52(12): 2515-2525, Dec. 2005.
J. Ryckaert et al., "A 16mA UWB 3-5GHz 20Mpulses/s quadrature analog correlation receiver in 0.18•mCMOS," IEEE Int. Solid-State Circuit Conf. Digest of Tech. Papers, Feb. 2006.
ITRS (Int. Technology Roadmap for Semiconductors) 2004 Edition. [Online]. Available: http://public.itrs.net. (printed Apr. 23, 2010).
International Search Report in PCT/EP2007/051052 (mailed Jun. 1, 2007).

\* cited by examiner

DEVICES COMPRISING DELAY LINE FOR APPLYING VARIABLE DELAY TO CLOCK SIGNAL

TECHNICAL FIELD

The invention relates to devices using a delay line for applying a variable delay to a clock signal, for example for synchronizing the clock signal to a data signal. The device can for example be an Ultra Wide Band (UWB) receiving or transmitting device, in particular those devices, designed for low power consumption, by enabling power on and off switching of parts of said device like analog to digital converters and integrators, during timing windows.

BACKGROUND ART

The Federal Communications Commission (FCC) has authorized ultra-wide-band (UWB) communication between 3.1 GHz and 10.6 GHz. Since UWB pulses rely on ultra-short (nanosecond scale) waveforms to have UWB spectral occupancy, UWB radios come with unique advantages: i) enhanced capability to penetrate through obstacles; ii) ultra high precision ranging at the centimeter level; iii) potential for very high data rates along with high user capacity; and iv) smaller circuit sizes with less power consumption.

On the other hand, these ultra-short UWB signals bring some drawbacks. For many receiver architectures, a large percentage of the power dissipation is associated with the estimation of the timing offset of UWB signals. This estimation of the timing offset is the so-called acquisition. For the acquisition, a scan of all clock phases in the full UWB pulse frame is done by means of a delay line in order to find a timing position in the pulse frame such that this timing position has sufficient correlation energy for a known trail of pulses. The acquisition delay line requires a high degree of accuracy (typically ½ of the pulse duration, 1 ns) and coverage of the full frame duration that can range from 10 ns to 300 ns. So far there is no solution for a low-power delay line that features an update of the delay in a single or only a few clock cycles over a wide range/wide-spread of delay values.

More in general, delay lines have been described for example in Hsiang-Hui Chang et al., "A Wide-Range Delay-Locked Loop With a Fixed Latency of One Clock Cycle", IEEE Journal Of Solid-State Circuits, Vol. 37, No. 8, August 2002, and in Yi-Ming Wang et al., "A Low-Power Half-Delay-Line Fast Skew-Compensation Circuit", IEEE Journal Of Solid-State Circuits, Vol. 39, No. 6, June 2004. In the latter document, a delay line is described composed of a plurality of delay units, arranged in series, and a tracking mechanism for tracking the propagation of the clock signal through the delay line. The tracking mechanism measures at the input of each of the delay units and is therefore highly power consuming.

DISCLOSURE OF THE INVENTION

It is an aim of the invention to provide a device having a delay line for applying a variable delay to a clock signal which shows a reduced power consumption, substantially without adversely affecting switching speed.

The device of the invention comprises a delay line and an associated controller for controlling the variable delay of the delay line. The delay line comprises a plurality of concatenated delay banks arranged between a clock signal input and a clock signal output. The delay banks provide different delay values with respect to each other. A bypass is provided parallel over each of said delay banks. Switching elements associated with each of said delay banks are provided for selecting either the respective delay bank or the respective bypass. Upon setting the delay, the controller applies settings to these switching elements. The delay line according to the invention is characterised in that each of the delay banks is provided with a delay bank status indicator, which indicates the propagation of the clock signal through the respective delay bank. This information is provided to the controller, which thus knows how far the clock cycle has propagated through the delay line and can take this information into account when new settings have to be applied to the switching elements.

The power consumption of the device of the invention can be severely reduced in view of the fact that the delay units are arranged in banks and only an indicator is used for indicating the status of the whole bank. This severely restrict the amount of data which the controller has to interpret upon changing the settings of the delay line and hence the power consumption. Furthermore, the use of concatenated delay banks and the signalling between the banks and the controller can significantly simplify the controller and allows up to single cycle delay changes.

As a result of the delay bank status indicators, the controller can verify the input-output behaviour of the delay line and take appropriate action when new settings have to be applied. The controller exploits the indicated status of the delay banks and can for example performs act on the delay line circuit in order to imply conditions on the signal levels within said delay line (for instance in order to remove the edge from the delay line).

The concatenation of the delay banks in the device of the invention means that the delay banks are arranged such that any combination of their delay values can be realized between the input and output. The required delay value to be applied to the inputted clock signal is programmed by setting the switching elements, which are for example formed by multiplexing circuits.

In a preferred embodiment, the delay banks have consecutive binary-weighted delay values, such that the switching elements are switchable by means of binary configuration vectors. Preferably each of the delay banks comprises a consecutive number of serially connected unit delay elements, said number ranging from 1 up to 2n, n being such that the sum of all binary-weighted delay values is at least equal to the clock cycle.

Optionally, the total delay can also be varied by changing the delay values of one or more of said delay banks. This can be done digitally, for example by switching off delay units of the delay banks, or analogously, for example by means of voltage controllable variable delay units.

Preferably, the banks are successively arranged in ascending order, so that the delay value of the delay banks increases from input to output. This has the advantage that the linearity degradation of the delay values could be limited.

In a preferred embodiment, the controller is provided with an arrangement for removing a transition edge of said clock signal from the delay line. This can be useful in a number of situations, for example upon switching from a large delay value to a small delay value or vice versa, to avoid glitches in the output. Such an arrangement can be formed by a register storing a digital value, representative of the clock signal propagation, a rotator for applying an appropriate rotation to the digital value and an element which temporarily fixes the level of the output clock signal until the transition edge is removed.

In another preferred embodiment, the controller is provided with an inverter at the clock signal output. This can for example be advantageously used in order to synchronize two systems that operate at the same clock but under the presence of a large skew between them.

In a preferred embodiment, the controller detects a transition edge of the clock signal which propagates through the delay line at the moment when the opposite transition edge occurs at the output of the delay line. This has the advantage that some situations where there is a high risk for a glitch at the output can be detected and appropriate action can be taken.

In a further preferred embodiment, the device is further equipped with a skipping circuit which detects those operational circumstances where a proper input-output behaviour can not be realized by the above proposed approaches and consequently skips a cycle. An example of such a circumstance is the appearance of a large delay step in two consecutive clock cycles.

The delay line circuit as proposed above is capable of providing changes in delay between input and output with large amplitude and this in a small amount of cycles, even in a single cycle.

In an embodiment the device of the invention comprises two of said delay line circuits, for example one for applying a coarse delay and another for applying a fine delay to the clock signal. Such a fine and coarse delay line can for example be used in a system clock generation circuit for generating a system clock in synchronisation with a received signal comprising a known train of pulses, In an embodiment the device is a duty cycle generator for generating one or more of operation windows for switching on and off parts of a device. In the preferred embodiment, the duty cycle generator comprises a system clock input for receiving a system clock, a first delay line as described above for applying a variable delay to the system clock, and a pulse position modulation window generator connected to the system clock input and the output side of the first delay line, provided for generating an output signal comprising interleaved pulse position modulation windows from said system clock and said delayed system clock. In this way, multiple transition edges are provided within each clock cycle of the system clock from which multiple operation windows for different components can be generated. These operation windows are generated by means of a second delay line as mentioned above for applying variable delays to the output signal of the pulse position modulation window generator and a pulse generator having multiple connections with said second delay line. This pulse generator is provided for generating said operation windows on the basis of signals appearing at a selection of said connections with the second delay line, i.e. transition edges delayed at different values within each system clock cycle.

BRIEF DESCRIPTION OF THE DRAWINGS

The invention will be further elucidated by means of the following description and the appended figures.

MODES FOR CARRYING OUT THE INVENTION

Figure 1:
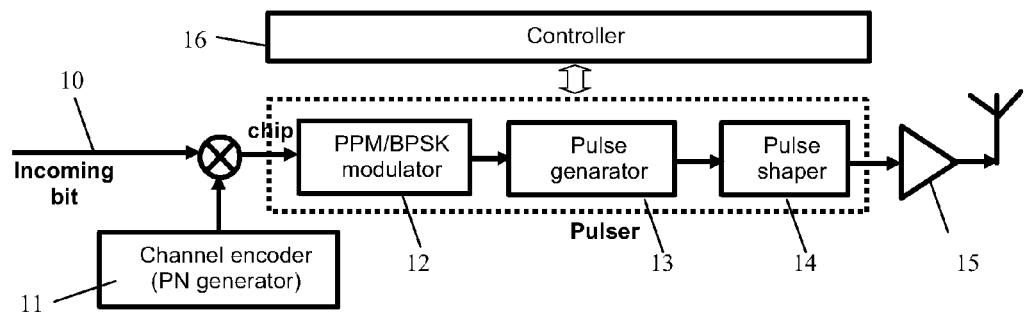
FIG. 1: Architecture of the transmitter.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and that the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

In the following, different aspects of the invention will be described in detail, with some references to other documents [1]-[8] which are hereby incorporated by reference in their entirety.

I. General Remarks

The Federal Communications Commission (FCC) has authorized ultra-wide-band (UWB) communication between 3.1 GHz and 10.6 GHz [1]. Since UWB pulses rely on ultra-short (nanosecond scale) waveforms to have UWB spectral occupancy, UWB radios come with unique advantages [2]: i) enhanced capability to penetrate through obstacles; ii) ultra high precision ranging at the centimeter level; iii) potential for very high data rates along with high user capacity; and iv) smaller circuit sizes with less power consumption.

On the other hand, these ultra-short UWB signals bring some drawbacks. For the receiver architecture presented in [3], [4] and for many other architectures, a large percentage of the power dissipation is associated with the estimation of the timing offset of UWB signals [2]. This estimation of the timing offset is the so-called acquisition. For the acquisition, a scan of all clock phases in the full UWB pulse frame is done by means of a delay line in order to find a timing position in the pulse frame such that this timing position has the maximum correlation energy for a known trail of pulses. The acquisition delay line requires a high degree of accuracy (typically ½ of the pulse duration, 1 ns) and coverage of the full frame duration that can range from 10 ns to 300 ns. There is a need for a new architecture that allows a single-cycle update of the clock offset over a wide-range as well a wide-spread of delay values. For some acquisition algorithms, the latter issue becomes more important where the delay increment in one cycle could be quite close to full pulse frame [2]. This mostly results in a clock output with a smaller pulse-width that causes a functional failure in the digital baseband operation. So far there is no solution for a delay line that features a single-cycle update over a wide-range/wide-spread delay values.

The proposed delay line and duty cycle generator have been implemented for timing generation in a 0.18 μm UWB receiver. These circuits have a measured power consumption of only 2.1 mW for a 20 MHz clock input with 50% duty cycle in 0.18 μm CMOS. The impact of delay-line based acquisition on the performance of the 0.18 μm UWB receiver is demonstrated by measurements.

II. UWB Transceiver Architecture and Clocking Circuits

The architecture of the transmitter is given in FIG. 1. In the transmitter the incoming data bit stream 10 is multiplied with a code for code division multiple access and/or for smoothing the spectrum of the transmitted signal, supplied from channel encoder 11. Then the coded sequence enters the pulser, which comprises three modules, PPM/BPSK modulator 12, pulse shaper 14, and pulse generator 13. In the case of PPM modulation, each chip of the coded sequence is converted to a sequence of unit pulses with or without a time shift depending on the value of each bit in the coded stream. This time shift is smaller than the period of the chip period (pulse frame). In the case of BPSK modulation, the phase of each pulse is inverted or not depending on the value of each bit in the coded stream. The generated pulses are then shaped by the pulse shaper 14 in order to make the pulse compliant to the FCC spectrum requirements. Other components of the transmitter are a power amplifier 15 and a controller 16, which controls the pulser 12-14.

Figure 2:
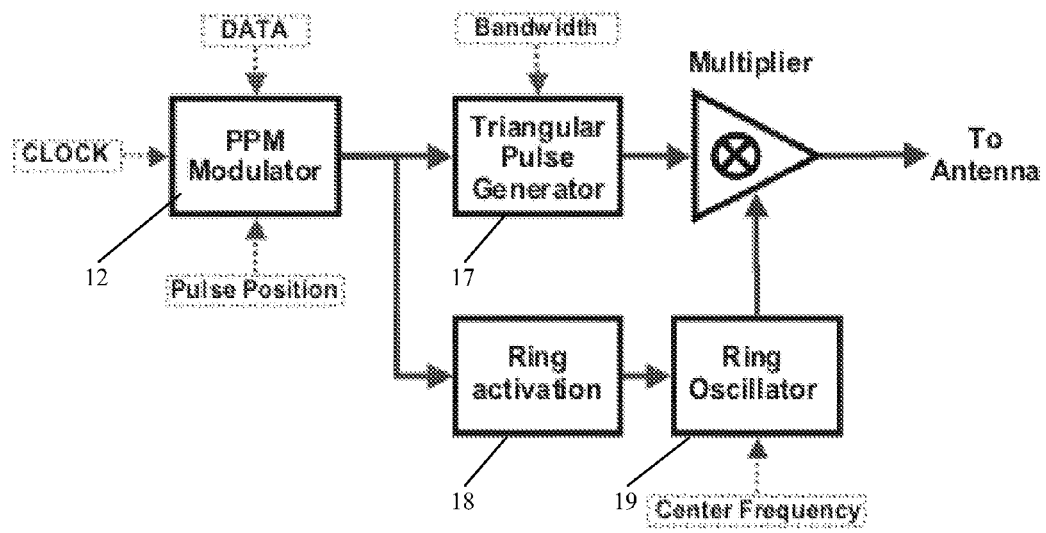
FIG. 2: Architecture of the pulser.

As part of the UWB transmitter system, in [5] we have presented a 0.18 μm CMOS carrier-based UWB pulse generator employing a triangular pulse shaping. The pulser in [5] comprises a triangular pulse generator 17 and a ring oscillator 19. The block diagram of the pulser is shown in FIG. 2. The triangular pulse has a duration that can be adapted in accordance with the desired bandwidth. A gating circuit (ring activation circuit 18 in FIG. 2) activates the ring oscillator when a pulse must be transmitted, avoiding useless power consumption between the pulses. The triangular signal is multiplied with the carrier created by the ring oscillator, resulting in an up-converted triangular pulse at the output. The measurements indicate that the pulser consumes only 1 mW burst power for a pulse repetition rate of 20 MHz.

Figure 3:
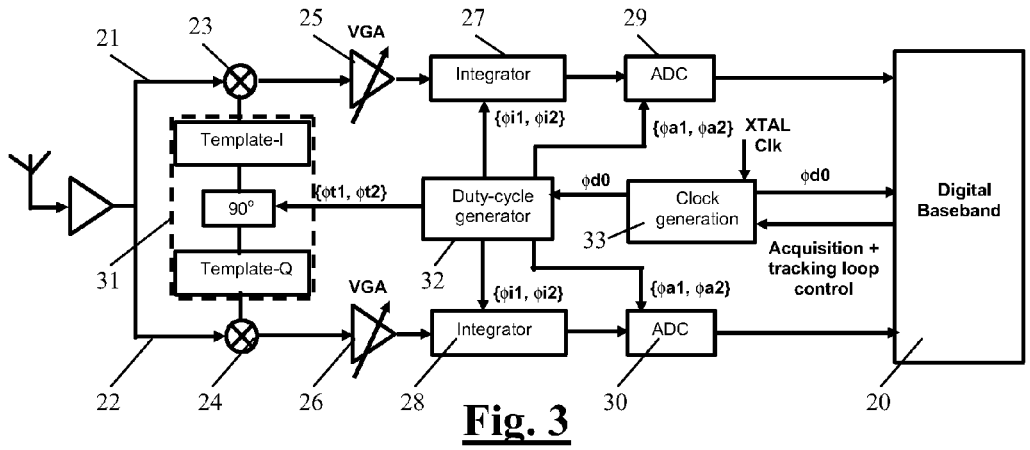
FIG. 3: Quadrature correlation receiver architecture.

The architecture of the receiver is given in FIG. 3. This architecture has been introduced in [6] and [7]. After giving a short introduction about the architecture, we will further elaborate the timing circuits in addition to the information given in [6] and [7]. The receiver comprises an I-branch 21 and a Q-branch 22, each having a correlator 23, 24, a variable gain amplifier 25, 26, an integrator 27, 28 and an A/D-covertor 29, 30.

In order to optimally receive the UWB signal, the incoming pulse is correlated with a template signal that is synchronized with the received pulse. This template signal is generated by a pulser 31, possibly the same pulser circuitry used in the transmitter, but here generating a template for each branch 21, 22. Any timing inaccuracy is translated into a phase shift in the complex plane where this phase shift can be processed in the digital baseband part 20 to track the timing inaccuracy. Matched filtering is achieved through an analog integration operation over a precise time window. The time window is defined by the duration between the start of the integration process and the sampling instant controlled by the duty-cycle generator circuit 32 as shown in FIG. 3. The optimum window of this correlation corresponds to a duration of length ⅔ of that of the triangle with a correlation of 0.9428 (0.5 dB loss). In the case of PPM modulation, a correlation is done at each possible position of the pulse (2 positions in the case of binary PPM).

The proposed receiver allows the digital baseband 20 to operate at the pulse repetition frequency. Therefore, the power consumption of the digital baseband is significantly reduced. Also further power consumption is achieved by the fact that all analog circuits as well as the ADCs operate in a duty-cycle fashion within a single pulse frame. This means that they are only active in defined time windows where for PPM the front-end is active in the time windows for each of the defined PPM positions within a single pulse frame. This significantly reduces the power consumption of the analog circuits. The location of these time windows is set by means of the synchronization circuits in the digital baseband through the clock/timing generation circuitry 32, 33 (see FIG. 3). In order to accomplish small time intervals in a single pulse frame relies on the fact of employing special design techniques and circuits with fast start-up times. The invention focuses on the generation of these time windows as well as of the timing offset.

The duty cycle generator (DCG) circuit 32 is responsible for the generation of multi-phased signals that enable/disable the operation of the analog circuits in a certain time window. The DCG circuit is composed of two serially cascaded delay lines (DLs), the first for the PPM delay and the second for setting the required time window(s) for the analog circuit(s) under consideration. For the latter, the time windows are generated by selecting the appropriate phases from the DL to define the start and the end of the time windows. The input to the DCG circuit is the system clock, which has the same frequency as that of the pulses. The system clock also serves as the clock of the digital baseband. Timing of the time windows for sequencing the analog operations is given in FIG. 4.

Figure 5:
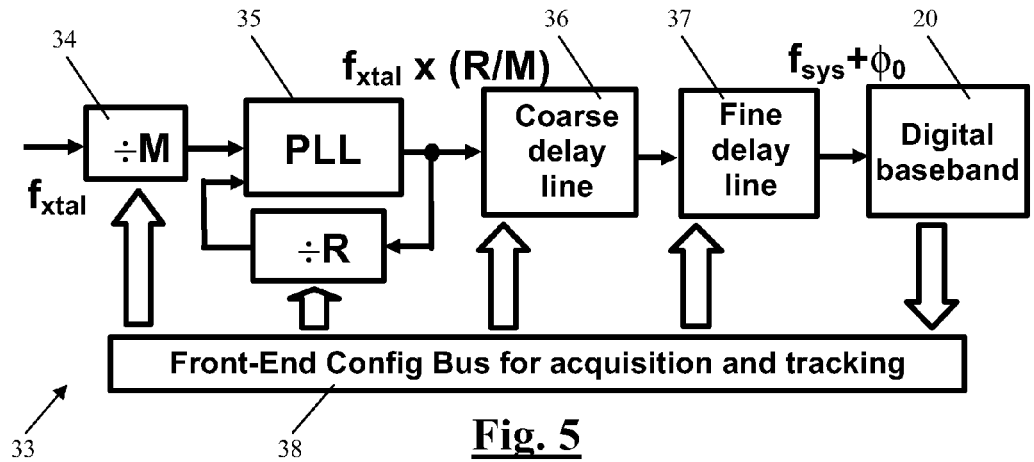
FIG. 5: Closed-loop control for the frequency/phase recovery of the system clock.

The system clock is generated by the clock generation circuit 33. The clock generation (+recovery) circuit is composed of a fractional phase-locked-loop (PLL) 34-35 and a clock delay line comprising of two DLs 36-37, one for the coarse tuning (coarse acquisition) and the other for the fine-tuning (tracking) of the clock phase. Coarse acquisition mode deals with the recovery of the initial phase of the clock. Therefore, a scan of all clock phases in the full pulse frame is done by means of the coarse DL 36 through a close-loop control system in order to detect the energy of a known trail of pulses at any position in the pulse frame, and covering full frame duration. Coarse acquisition requires a high degree of accuracy (typically ½ of the pulse duration) and coverage of the full frame duration. Tracking mode deals with the compensation of small frequency/phase drifts of the clock in order to maximize the energy of the received data. In this mode, through a closed-loop control system, the frequency and phase drifts are handled by the PLL 35 and the fine DL 37, respectively. This closed-loop control system for the clock recovery is shown in FIG. 5. The fine DL 37 has a much better accuracy than that of the coarse acquisition (e.g. 1/20th of the pulse duration). The baseband 20 controls the components via the front-end configuration bus 38 for acquisition and tracking.

III. Detailed Description of the Circuits

Figure 4:
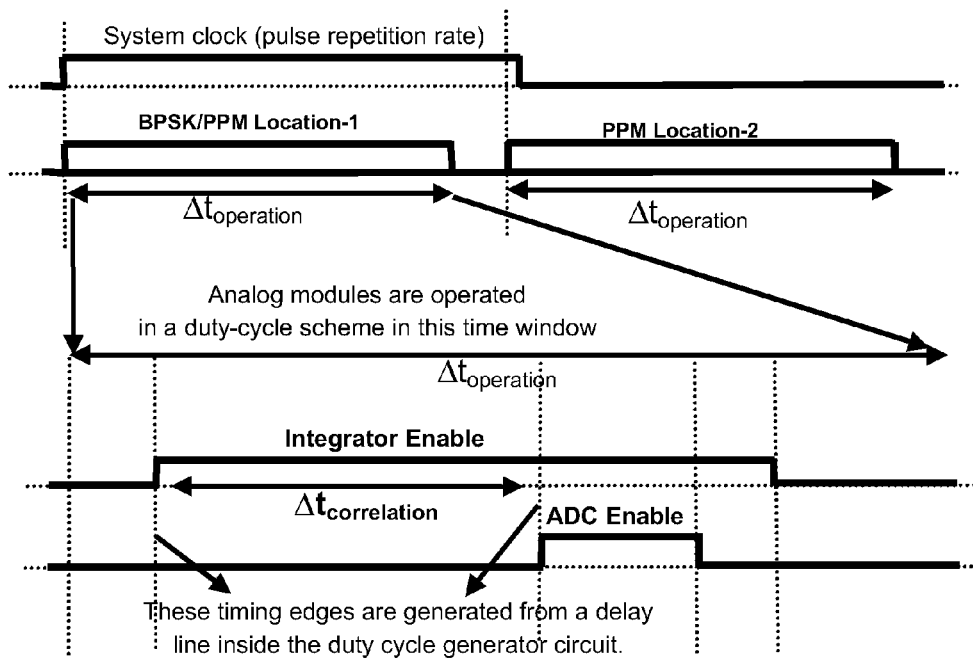
FIG. 4: Timing of the analog signal processing operations in a duty-cycle scheme.
Figure 6:
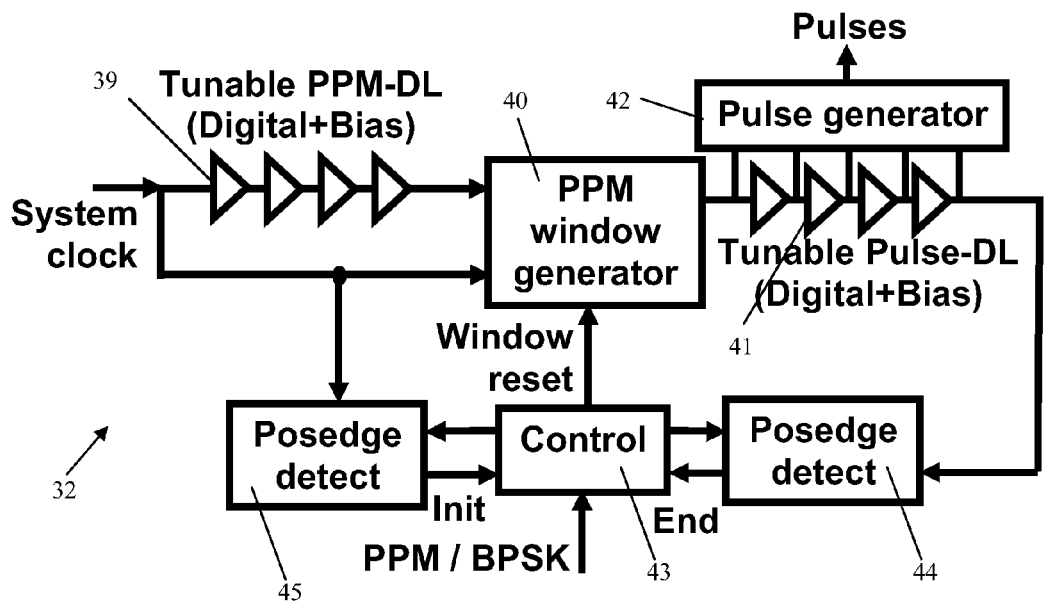
FIG. 6: Block diagram of the programmable duty cycle generator.

The block diagram of the programmable duty cycle generator (DCG) 32 is shown in FIG. 6. First the system clock is delayed by the tunable PPM DL 39 where the PPM delay value can be set by digital configuration bits and/or bias voltage. Following this operation, by using delayed and non-delayed outputs of the PPM DL 39, the PPM window generator 40 outputs a signal that defines two PPM windows interleaved in time as illustrated in FIG. 4. The pulse that defines the PPM windows becomes the input of the Pulse DL 41 that is responsible for setting the durations of operation windows where a corresponding analog circuit is active. These operation windows are generated by means of a pulse generator 42 that selects certain locations on the Pulse DL 41. The buffers at the output of the pulse generator 42 can drive on-chip loads up to 1 pF. These windows are then distributed to the corresponding analog/digital circuits.

The state machine 43 that controls the PPM windows is initiated by the positive edge 45 of the incoming clock and ended by the positive edge 44 at the output of the Pulse DL 41. By the end signal the controller triggers the PPM window generator 40 to reset the corresponding PPM window. This sequence of operations is repeated for the next PPM window of the pulse frame and then followed by the PPM windows of the next pulse frames.

Figure 7:
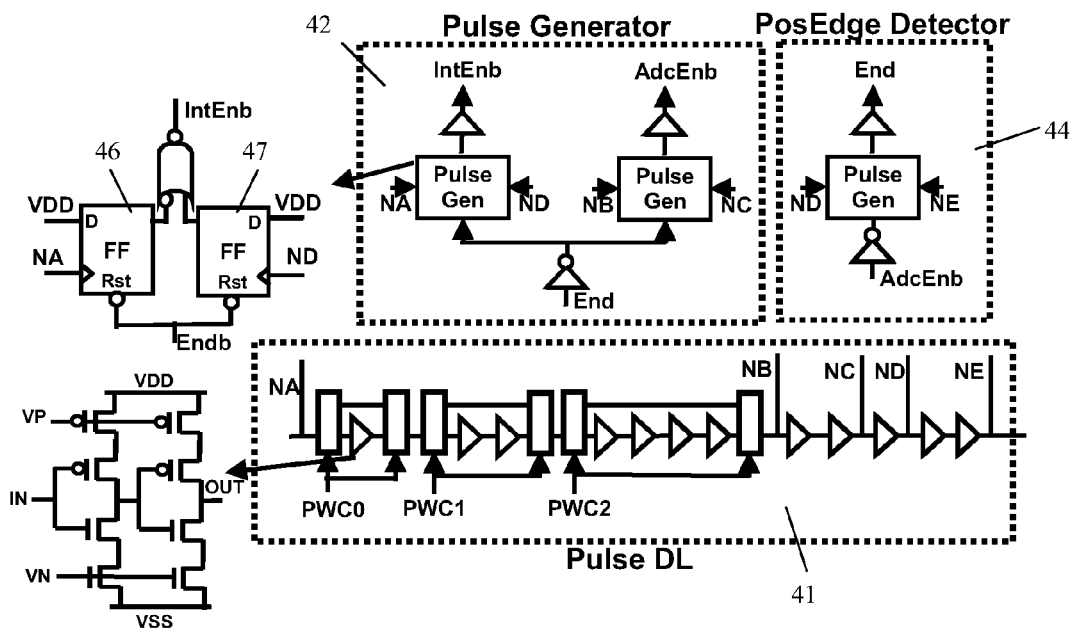
FIG. 7: Schematic of the pulse generator together with the Pulse DL and the positive edge detector.

FIG. 7 shows the schematic of the pulse generator 42 together with the Pulse DL 41 and the positive edge detector 45. Every window is generated by a combinatorial operation for the outputs of two flip-flops 46, 47. These flip-flops are edge-triggered by the signals at different stages of the Pulse DL 41. The early/late stage defines the beginning/end of the operation window. Then these flip-flops are reset by the pulse generated by the positive edge detection circuit where it is reset by the first operation window of the next PPM window.

The DCG circuit 32 has three important features:

Since generation of the PPM window is based on edge-driven operation, the DCG circuit is not dependent on the duty cycle of the incoming clock, which is indeed an important feature that removes the duty-cycle requirements of the clock generation.

Since generation of the operation windows is based on edge-driven operation, one can fully utilize the pulse frame. If one uses a combinatorial window generation rather than the proposed edge-driven window generation, then operation windows at the next PPM window could only be generated after the arrival of both positive and negative edges, first positive and then negative, at the output of the pulse DL. Therefore, in the case of combinatorial window generation, the minimum value ($[T_f]_{min}$) of the pulse frame is given by:

$$[T_f]_{min} = T_{PDL} + 2T_{PDL} + T_{DCG} \text{ where } T_{PPM} > 2T_{PDL}$$

$$[T_f]_{min} = 4T_{PDL} + T_{DCG} \quad (1)$$

where $T_{PDL}$ is the total delay of the Pulse DL (about 8 ns for our UWB system). $T_{PPM}$ is the PPM delay (>16 ns).

$T_{DCG}$ is the additional delay (typically 2 ns) in order to model the delay introduced by DCG circuit itself. Using these value, we have $[T_f]_m = 34$ ns.

In the proposed edge-driven window generation, operation windows at the next PPM window could be generated just after the arrival of positive edge at the output of the pulse DL without a need for the arrival of the negative edge. Therefore, in the case of edge-driven window generation, the minimum period of the pulse frame is given by:

$$[T_f]_{min} = T_{PDL} + 2T_{PDL} + T_{DCG} \text{ where } T_{PPM} > T_{PDL}$$

$$[T_f]_{min} = 2T_{PDL} + T_{DCG} \quad (2)$$

In this case, we have $[T]_{min} = 18$ ns, which is around 88% much faster than the system with combinatorial window generation. Therefore, the proposed edge-driven window generation is crucial for further increasing the overall data rate of the system.

The DCG circuit allows an independent control for the PPM delay and the duration of the operation windows. This is important since any update on the duration of the operation window(s) does not require an additional update on the PPM delay value.

Figure 8:
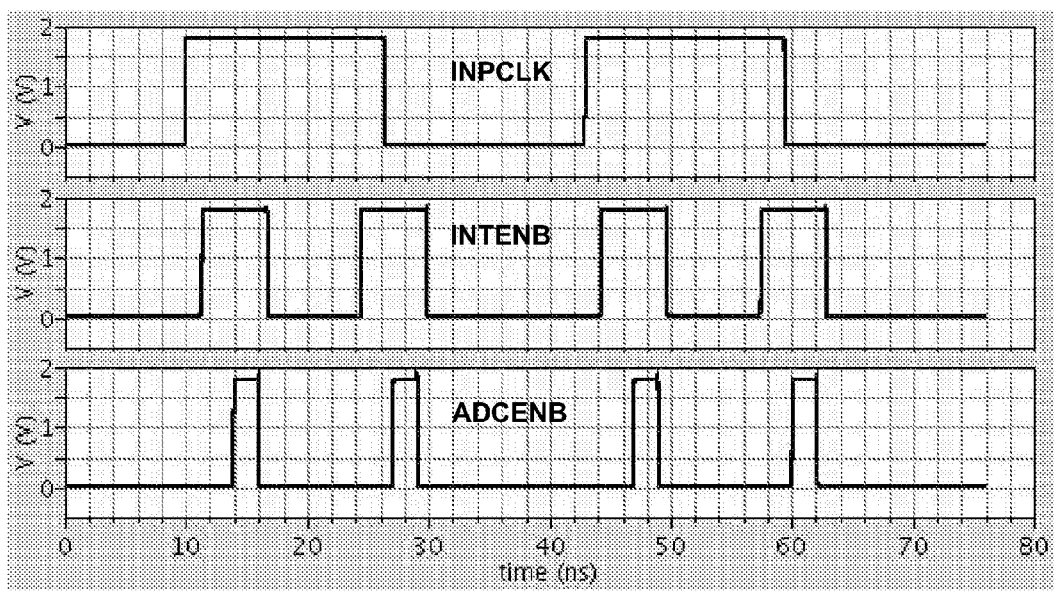
FIG. 8: Simulated waveforms of the input clock (InpClk) and operation window outputs (IntEnb and AdcEnb) of the duty-cycle generator circuit in 0.18 μm CMOS.

The DCG circuit 32 has been realized in a standard digital 0.18 μm CMOS process. FIG. 8 shows the post-layout simulation results of the operation windows for two consecutive pulse frames at 33 MHz for a PPM delay of 13.15 ns and a correlation duration of 2.6 ns. We have a simulated power consumption of 0.53 mW for the DCG where this power consumption also includes the buffers used for distributing the pulse windows across the chip.

Figure 9:
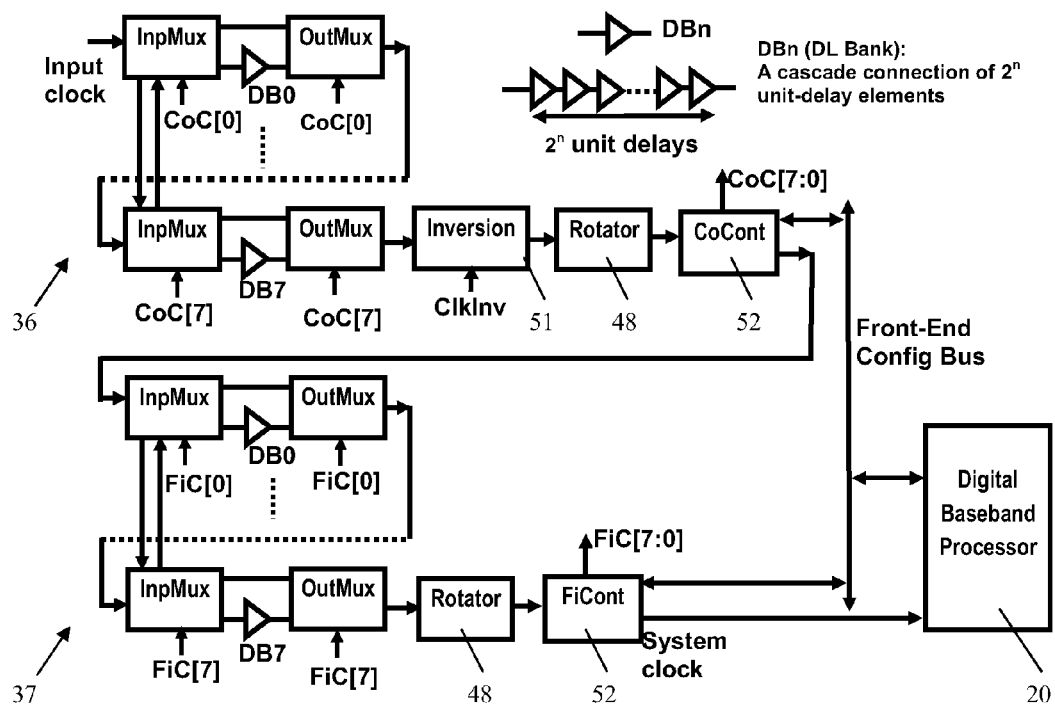
FIG. 9: Block diagram of the programmable delay line for UWB acquisition.

The architecture of the programmable clock delay line (CDL) 36, 37 is shown in FIG. 9. Similar delay lines may be used in as the delay lines 39, 41 of the DCG 32.

The CDL circuit is responsible for setting the phase of the system clock through two cascaded sets of CDL circuits, coarse CDL circuit 36 followed by fine CDL circuit 37. Each circuit is programmable by eight configuration bits where each bit selectively enables/disables each of the eight cascaded DL banks (DB0-DB7) that have binary-weighted delay values, which are generated by serially cascaded unit-delay elements. In addition, for coarse DL circuit 36 each unit delay value can be tunable by a bias voltage.

Figure 10:
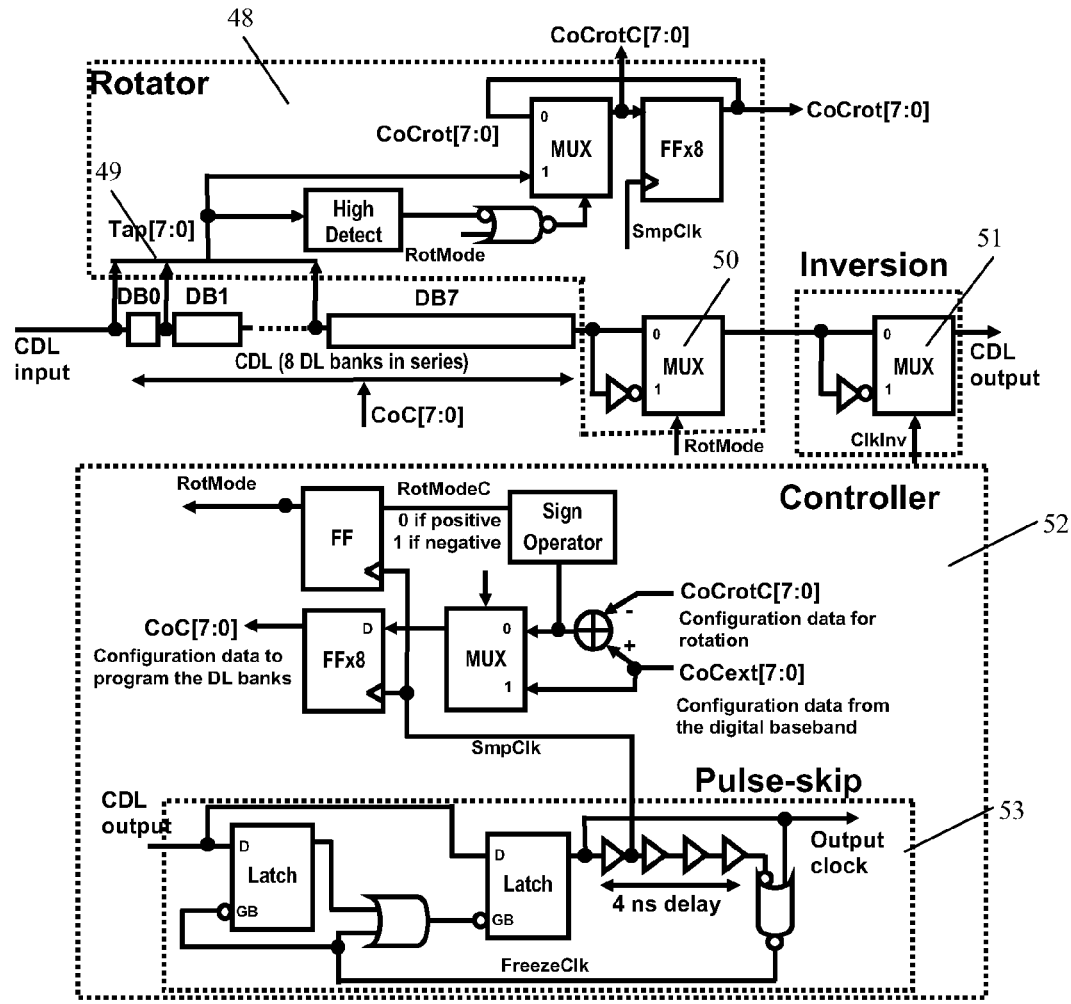
FIG. 10: Schematic of the rotator, the DL controller, and the inversion circuits.

The clock propagation starts from the DL bank that has the minimum delay where the next DL banks are connected in series in the ascending order of delay values. Therefore, a rising edge occurs at these early DL banks when a falling edge is detected at the CDL output. In this way, the linearity degradation of the delay values could be limited. However, an ideal solution could be achieved by keeping the rising edge of the clock out of the complete CDL range at the time when a falling edge is detected at the output of CDL. The schematic of circuits that are responsible for keeping the rising edge out of the complete CDL range is shown in FIG. 10. The rotator circuit 48 stores in a register 49 the value Tap[7:0] of the vector formed by the logic levels at the input of each DL bank DB0-DB7. The bits of this vector function as delay bank status indicators, indicating the propagation of the clock edge through the delay line towards the controller 52. The rotator 48 detects the rising edge in the vector and rotates the value to shift the rising edge towards the end. The obtained value is called the delay value of rotation, which is indicated as CoCrot[7:0] in FIG. 10. So by means of the rotator 48, the controller 52 is provided for detecting the location of the rising edge in the delay line and taking this information into account upon determining new configuration data CoC[7:0].

For delay values larger and equal to CoCrot[7:0], the output clock is inverted by means of inverter circuit 50 and the delay value of rotation (CoCrotc[7:0]) is subtracted from the programmed delay value (CoCext[7:0]) in the controller 52 which so computes the delay value for the rotated case. In this way, the rising edge is shifted to the end of DL banks by means of timing gain by the inversion of the output clock. The CDL circuit flags out a status signal (RotMode in FIG. 10) for the digital baseband controller 20 that informs that the CDL circuit is in rotation mode. In addition to this automatic rotation to invert the clock, it is possible for the digital baseband controller to directly program the CDL to invert the output clock in order to synchronize two systems that operate at the same clock but under the presence of a large skew between them. In FIG. 10 this procedure is handled by the inversion circuit 51.

The proposed scheme of automatic clock rotation allows the CDL circuit to operate in the full clock period with the delay values that linearly scale with the configuration bits. In addition, no unwanted pulses occur due to the memory effect of the delay line. Here, we call this unwanted behavior as "pulse" rather than "glitch" since these unwanted pulses could have a pulsewidth as long as the DL bank where this unwanted behavior comes from.

Please note that the configuration bits do not necessarily toggle at the same time due to the unwanted skews as a result of loading conditions caused by the unbalanced interconnect and the fanout. This skew across the configuration bits could then create glitches at the input of each DL bank DB0-DB7. Although these glitches could disappear due to the insensitivity of the DL to such glitches as they penetrate through the DL. On the other hand, another mechanism that rules out these glitches can be preferred over the above-mentioned mechanism that relies on a balanced layout, which is not always possible due to size and system constraints. In addition, clock rotation can possibly create glitches due to difference between the time to detect the falling edge and the time to rotate the clock.

Figure 11:
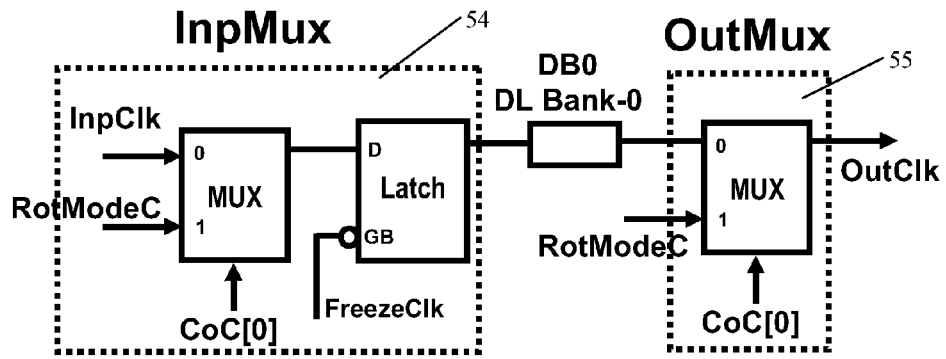
FIG. 11: Schematic of the InpMux and OutMux circuits for the first delay bank (DB0).

Such other mechanism that rules out these glitches is for example shown in FIG. 11. The InpMux circuit 54 freezes the input of the DL bank by means of a latch during the time when the configuration changes. The gating signal (FreezeClk in FIG. 10) of the latch is generated immediately after the falling edge of the output clock by the CDL controller. The pulsewidth of the gating signal is about 4 ns. At the beginning of the gating duration, the CDL controller 52 creates the clock signal (SmpClk in FIG. 10)), which retimes the configuration bits in order to reduce the skew between them. So, the DL banks DB0-DB7 are configured inside this gating duration while no input is allowed to propagate through the DL banks. During this duration, the CDL controller also freezes the system clock output. The InpMux circuit 54 at the input of each DL bank also resets the DL bank at the cycles that they are not utilized. Similarly, the OutMux circuit 55 selects the output of the DL bank when it is utilized; otherwise it resets the DL bank to RotModeC. In this way, power consumption is reduced by eliminating this redundant switching. Resetting the DL bank is performed immediately after the masking signal. FIG. 11 shows the schematic of the InpMux and OutMux circuits 54, 55.

The CDL controller 52 also employs a pulse-skip circuit 53 that is responsible for removing the pulses that have a pulsewidth smaller than 4 ns. The schematic of the pulse-skip circuit is indicated in FIG. 10. A pulse with a pulsewidth smaller than 4 ns occurs when a requested delay value is decreased with a delay step larger than a value given by the clock pulsewidth (of the logic level low) minus 4 ns. We call this value of delay step as the critical delay step. In these cases, the clock cycle that has a violation of minimum pulsewidth occurs is skipped for the sake of providing a safe clock for the digital baseband. This is also no problem for robust operation of the acquisition algorithm since no clock edge is seen by the digital baseband during this skipped clock cycle. This situation typically occurs at the end of the acquisition when the system immediately goes back to a delay value that gives the maximum correlation energy. This going back procedure can still require a delay step larger than the critical delay step where this is no problem with the proposed DL for a robust operation of the digital baseband.

Figure 12:
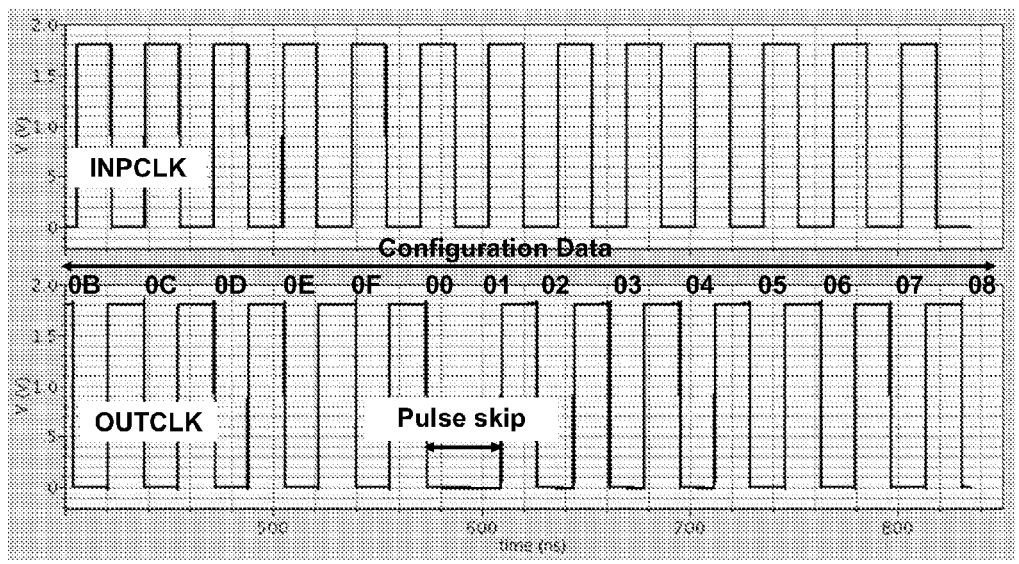
FIG. 12: Simulated waveforms of the input clock (InpClk) and the output clock (OutClk) of the coarse delay line circuit in 0.18 μm CMOS. Simulated value of the delay step is 0.92 ns.
Figure 13:
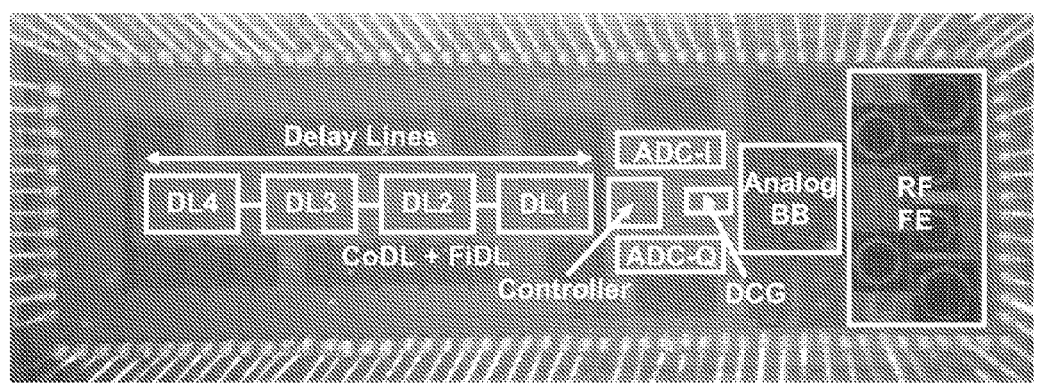
FIG. 13: Microphotograph of the chip.

Above, we have briefly presented the CDL circuits that allow delay values as large as the full clock period (UWB pulse frame) where these delay values could be configured at every clock cycle and have large steps. The CDL circuit has been realized in a standard digital 0.18 μm CMOS process. FIG. 12 shows the post-layout simulation results of the input/output clocks at 33 MHz where a pulse-skip situation is demonstrated. For this 33 MHz clock, we have a simulated power consumption of 0.41 mW when the cycle-to-cycle delay configuration of the coarse CDL is stepped from zero to 16 and then stepped from zero to 8. The circuit has an offset delay of 5.6 ns when none of the delay elements is utilized (in other words when the delay configuration is zero).

At 33 MHz, the maximum power consumption becomes 1.62 mW when all DL banks are fully utilized in both coarse and fine CDL circuits. Power consumption due to leakage is 40 nW. The total delay of the circuit could be changed to 264 ns where the coarse delay is changed in 256 steps with a unit delay of 0.92 ns while the fine delay is changed in 256 steps with a unit delay of 70 ps. The unit delay step of the coarse delay could be further increased by setting the bias voltages. The proposed delay line requires a clock input with 50% duty-cycle for robust operation of the rotation algorithm. The circuits preserve the 50% duty-cycle of the incoming clock. For the coarse delay, the growth of clock pulsewidth for the logic-level high is limited to 35 ps for each unit delay (so a total of 8.96 ns for 256 delay elements) while for the fine delay this growth is limited to 2 ps (therefore a total of 0.51 ns in 256 delay elements). In reality, coarse acquisition in UWB radios should utilize the delay lines for the full period of the pulse period. In this case, for an input clock with a 50% duty cycle, duty-cycle at the output becomes 53.6% when the delay line is fully utilized to span the full clock period. If the clock offset is smaller, then the duty-cycle at the output gets closer to 50%.

IV. Experimental Results

The presented programmable duty cycle generators and programmable delay lines have been fully integrated on a UWB receiver radio [7] in 0.18 μm CMOS technology. The parameter settings of the delay line and duty cycle generator as well as the other front-end settings such as the ADC calibration data are managed by an on-chip central controller that realizes the interfacing either with a PC through a parallel link or with an FPGA through a high-speed bus. The microphotograph of this ASIC is given on FIG. 7 with an indication of the duty cycle generator and programmable clock delay lines.

References

[1] IEEE 802.15.4a: www.ieee802.org/15/pub/TG4a.html.
[2] L. Yang and G. R. Giannakis, "Ultra-wideband communications: an idea whose time has come," IEEE Signal Processing Magazine, pp. 26-54, November 2004.
[3] S. Iida, K. Tanaka, H. Suzuki, N. Yoshikawa, N. Shoji, B. Griffiths, D. Mellor, F. Hayden, I. Butler, and J. Chatwin, "A 3.1 to 5 GHz CMOS DSSS UWB transceiver for WPANs," in ISSCC Digest of Tech. Papers, pp. 214-215, 594, February 2005.

[4] R. Blazquez, P. P. Newaskar, F. S. Lee, and A. P. Chandrakasan, "A baseband processor for impulse ultra-wideband communications," IEEE J. Solid-State Circuits, Vol. 40, No. 9, pp. 1821-1828, September 2005.

[5] J. Ryckaert, M. Badaroglu, C. Desset, V. De Heyn, G. Van der Plas, P. Wambacq, B. Van Poucke, and S. Donnay, "Carrier-based UWB impulse radio: simplicity, flexibility, and pulser implementation in 180 nm CMOS," in Proc. IEEE Int. Conf. on UWB, September 2005.

[6] J. Ryckaert, C. Desset, A. Fort, M. Badaroglu, V. De Heyn, P. Wambacq, G. Van der Plas, S. Donnay, B. Van Poucke, and B. Gyselinckx, "Ultra-wideband transmitter for low-power wireless body area networks: design and evaluation," IEEE Tr. Circuits and Systems Part I, Vol. 52, No. 12, pp. 2515-2525, December 2005.

[7] J. Ryckaert, M. Badaroglu, V. De Heyn, G. Van der Plas, P. Nuzzo, A. Baschirotto, S. D'Amico, C. Desset, H. Suys, M. Libois, B. Van Poucke, P. Wambacq, and Bert Gyselinckx, "A 16 mA UWB 3-5 GHz 20 Mpulses/s quadrature analog correlation receiver in 0.18 µm CMOS," in IEEE Int. Solid-State Circuit Conf. Digest of Tech. Papers, February 2006 [to be published].

[8] ITRS (Int. Technology Roadmap for Semiconductors) 2004 Edition. [Online]. Available: http://public.itrs.net.

The invention claimed is:

1. A device comprising:
    at least one delay line for applying a variable delay to a clock signal, wherein each delay line comprises:
        a clock signal input,
        a clock signal output,
        a plurality of concatenated delay banks between the input and the output, wherein the delay banks provide different delay values with respect to each other,
        a bypass parallel over each of the delay banks, and
        a switching element associated with each delay bank for selecting either the delay bank or the bypass; and
    a controller configured to control the variable delay of the at least one delay line, wherein:
        each delay bank comprises a delay bank status indicator for indicating propagation of the clock signal through the delay bank towards the controller, and
        the controller being configured to control the variable delay of the at least one delay line comprises the controller being configured to set the switching element for each delay bank based on the delay bank status indicator of the delay bank.

2. The device of claim 1, wherein the delay banks have consecutive binary-weighted delay values and each of the delay bank status indicators is a single bit.

3. The device of claim 1, wherein each of the delay banks comprises one or more unit delay elements, each of which provides substantially the same delay value.

4. The device of claim 1, wherein one or more of the delay banks is configured to vary its delay value.

5. The device of claim 1, wherein the delay banks are arranged in ascending order.

6. The device of claim 1, wherein the controller is provided with an arrangement for removing a transition edge from the delay line.

7. The device of claim 6, wherein the arrangement comprises a register for storing a digital value representative of the indicated propagation, an operator for performing a digital operation on said digital value to remove said transition edge, and a level fixing element for temporarily fixing the clock signal output at one of the levels of the clock signal.

8. The device of claim 1, wherein:
    the operator comprises a rotator for rotating the digital value, and
    the level fixing element comprises a switching for temporarily disconnecting the output from the delay line.

9. The device of claim 1, wherein the controller comprises an inverter at the output.

10. The device of claim 1, wherein the controller is configured to detect a transition edge of the clock signal that propagates through the delay line at the moment when the opposite transition edge occurs at the output of the delay line.

11. The device of claim 1, wherein the controller comprises a skipping circuit for skipping a clock cycle in the event of improper input-output behaviour.

12. The device of claim 1, wherein the device comprises two delay lines in series, one for applying a coarse delay value and the other for applying a fine delay value.

13. A system clock generation circuit for generating a system clock in synchronisation with a received signal comprising a known train of pulses, said circuit comprising;
    a coarse delay line for applying a coarse delay to said system clock, and a fine delay line for applying a fine delay to said system clock, wherein each delay line comprises:
        a clock signal input,
        a clock signal output,
        a plurality of concatenated delay banks between the input and the output, wherein the delay banks provide different delay values with respect to each other,
        a bypass parallel over each of the delay banks, and
        a switching element associated with each delay bank for selecting either the delay bank or the bypass;
    a controller configured to control the variable delay of the at least one delay line, wherein:
        each delay bank comprises a delay bank status indicator for indicating propagation of the clock signal through the delay bank towards the controller, and
        the controller being configured to control the variable delay of the at least one delay line comprises the controller being configured to set the switching element for each delay bank based on the delay bank status indicator of the delay bank;
    a phase locked loop; and
    control means configured to scan the train of pulses by controlling the phase locked loop, coarse delay line, and fine delay line.

14. The system clock generation circuit of claim 13, wherein the system clock generation circuit is a component of an ultra wide band receiver, and wherein the ultra wide band receiver further includes a duty cycle generator for generating operation windows for activating/deactivating external components, wherein the duty cycle generator comprises:
    a system clock input for receiving the system clock,
    a first delay line for applying a variable delay to the system clock,
    a pulse position modulation window generator connected to the system clock input and an output side of the first delay line, wherein the pulse position modulation window generator is configured to generate an output signal comprising interleaved pulse position modulation windows from the system clock and a delayed system clock,
    a second delay line for applying variable delays to the output signal, and
    a pulse generator having multiple connections with the second delay line, wherein the pulse generator is configured to generate the operation windows on the basis of signals appearing at a selection of the connections.

15. A programmable duty cycle generator for generating operation windows for activating/deactivating external components, the duty cycle generator comprising:
 at least one delay line for applying a variable delay to a clock signal, wherein each delay line comprises:
  a clock signal input,
  a clock signal output,
  a plurality of concatenated delay banks between the input and the output, wherein the delay banks provide different delay values with respect to each other,
  a bypass parallel over each of the delay banks, and
  a switching element associated with each delay bank for selecting either the delay bank or the bypass;
 a controller configured to control the variable delay of the at least one delay line, wherein:
  each delay bank comprises a delay bank status indicator for indicating propagation of the clock signal through the delay bank towards the controller, and
  the controller being configured to control the variable delay of the at least one delay line comprises the controller being configured to set the switching element for each delay bank based on the delay bank status indicator of the delay bank;
 a system clock input for receiving a system clock;
 a first delay line for applying a variable delay to the system clock;
 a pulse position modulation window generator connected to the system clock input and an output side of the first delay line, wherein the pulse position modulation window generator is configured to generate an output signal comprising interleaved pulse position modulation windows from the system clock and a delayed system clock;
 a second delay line for applying variable delays to the output signal; and
 a pulse generator having multiple connections with the second delay line, wherein the pulse generator is configured to generate the operation windows on the basis of signals appearing at a selection of the connections.

* * * * *